United States Patent [19]

Takeda et al.

[11] Patent Number: 4,658,956
[45] Date of Patent: Apr. 21, 1987

[54] PORTABLE CASE FOR A SMALL SIZE AUDIO-VISUAL SENSORY APPARATUS

[75] Inventors: Mituo Takeda; Katunobu Odamoto; Keiji Uraki, all of Osaka, Japan

[73] Assignee: El Planning System Ltd., Osaka, Japan

[21] Appl. No.: 739,018

[22] Filed: May 29, 1985

[30] Foreign Application Priority Data

| May 30, 1984 | [JP] | Japan | 59-80060[U] |
| Dec. 29, 1984 | [JP] | Japan | 59-200425[U] |
| Dec. 29, 1984 | [JP] | Japan | 59-200426[U] |
| Dec. 29, 1984 | [JP] | Japan | 59-200427[U] |
| Dec. 29, 1984 | [JP] | Japan | 59-200428[U] |
| Dec. 29, 1984 | [JP] | Japan | 59-200429[U] |
| May, 1985 | [JP] | Japan | 60-95146 |

[51] Int. Cl.⁴ ........................... B65D 43/16
[52] U.S. Cl. .................. 206/320; 150/52 J; 206/305; 220/259; 312/7.2; 358/254; 369/10; 455/351
[58] Field of Search ............ 150/52 J, 52 R; 206/305, 387, 320, 813, 460, 489; 312/7.1, 7.2; 358/254; 455/344, 348, 349, 351; 360/33.1; 369/10; 220/259

[56] References Cited

U.S. PATENT DOCUMENTS

| 2,335,015 | 11/1943 | Lantheaume | 206/813 |
| 3,023,885 | 3/1962 | Kindseth | 206/305 |
| 3,450,454 | 6/1969 | Anders | 358/254 |
| 3,471,947 | 10/1969 | Genser | 358/254 |
| 3,541,452 | 11/1970 | Disesa et al. | 455/351 |
| 4,132,295 | 1/1979 | Hochfelsen | 455/344 |
| 4,154,339 | 5/1979 | Dutra | 206/813 |
| 4,245,872 | 1/1981 | Kakigi | 312/7.1 |
| 4,398,212 | 8/1983 | Serry et al. | 206/320 |
| 4,440,457 | 4/1984 | Fogelman et al. | 312/7.2 |
| 4,458,813 | 7/1984 | Tushinsky et al. | 206/305 |

FOREIGN PATENT DOCUMENTS

| 1145678 | 3/1963 | Fed. Rep. of Germany | 358/254 |
| 2,263,915 | 7/1974 | Fed. Rep. of Germany | 206/305 |
| 2071043 | 9/1981 | United Kingdom | 150/52 R |
| 2092804 | 8/1982 | United Kingdom | 206/387 |

*Primary Examiner*—William Price
*Assistant Examiner*—Jimmy G. Foster
*Attorney, Agent, or Firm*—Birch, Stewart, Kolasch & Birch

[57] ABSTRACT

A portable case for audio-visual apparatus has a first case portion including a bottom portion and three side walls connected to the bottom to form a substantial portion of a generally rectangular box. There is a second case portion having a front cover and a top cover, and the second case portion covers the remaining space. There is a partition piece formed in the interior or the case which divides the case into two sections. One section contains a TV monitor and the other contains an audio means for developing the signal displayed on the TV monitor. A power source means is mounted in the case near the audio developing means to receive power from an external source, convert the AC power to DC power, and supply DC power to both the TV monitor and audio developing means.

10 Claims, 30 Drawing Figures

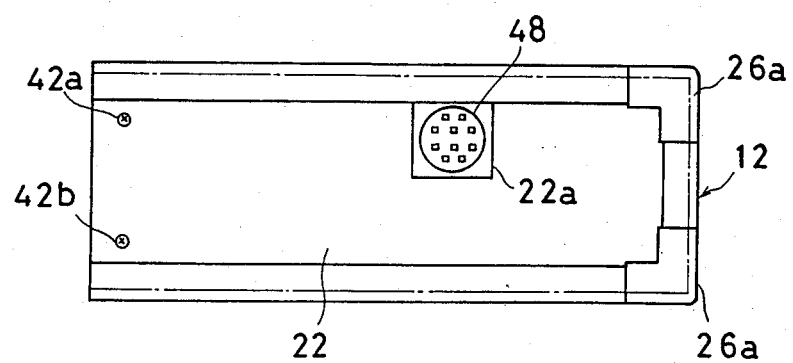
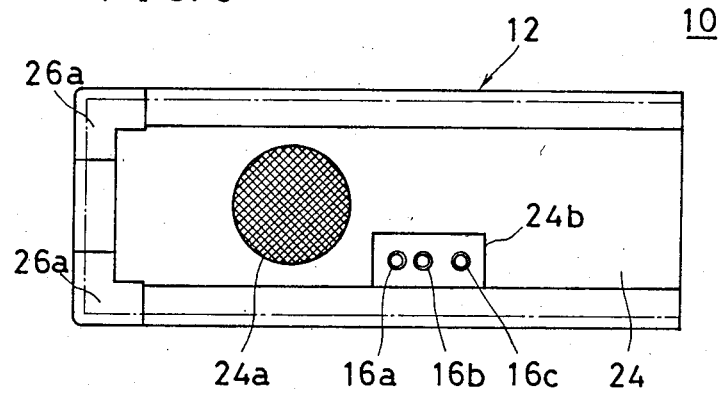

321

325

PORTABLE CASE FOR A SMALL SIZE AUDIO-VISUAL SENSORY APPARATUS

BACKGROUND OF THE INVENTION

1. Field of the Invention

The present invention relates to a portable case having a small size audio-visual apparatus such as a video deck, a TV monitor, etc., mounted therein.

2. Description of the Prior Art

It is well known to store and carry a small size audio-visual apparatus in a portable case. However, since such a caase is not provided with a power source, one integrated set with the respective audio-visual apparatus is used. Thus, it is necessary that each apparatus stored therein have its own power source.

The type and weight of the apparatus vary according to respective kind of small size audio-visual equipment. Accordingly, the volume of the case itself tends to be large. Furthermore, a suitable fixing pedestal is not provided between the small size audio-visual apparatus, for example, the TV monitor, video deck etc.

In such prior art portable cases, when storing an audio-visual sensory apparatus, the weight increases considerably as the number of power sources increases, resulting in difficulty in carrying for a long time. Moreover, since a fixing pedestal for each small size audio-visual apparatus is not provided, extra space between the small size audio-visual apparatus, for example, the TV monitor and the video deck will increase, thus resulting in a case very large in size. Moreover, the small size audio-visual apparatus will not be completely fixed in position, thus resulting in damage to the apparatus. For example, the external dimensions of the prior art case body measure 41 cm wide×17 cm deep×32 cm high at a minimum, and it weighs as much as 9.8 kg when storing the TV monitor and the video deck. Accordingly, it is too inconvenient for a man to carry on foot due to its heavy weight and bulkiness. Meanwhile, it is said that the weight which a man can carry about without feeling too much burden is normally around 4.5 kg to 6 kg in average. Many sales persons are usually carrying this amount thereabout. In view of the above fact, the prior art case is inadequate for carrying about.

As described above, the prior art case is heavy, bulky and troublesome in handling, thus resulting in a considerable inconvenience in carrying it about.

SUMMARY OF THE INVENTION

A principal object of the present invention is, therefore, to provide a small size and light-weight portable case for an audio-visual apparatus which is convenient to handle.

The present invention is directed to a portable case for a small size audio-visual apparatus having a power source mounted separately therefrom within the portable case.

According to an embodiment of the present invention, the weight is approximately two-thirds as compared with the total weight of a prior art case containing a small size audio-visual apparatus. Thereby, it is equivalent to the maximum weight of 6 kg which a man can normally carry about relatively easily.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 2 through 7 show an embodiment of the present invention, in which FIG. 2 is a perspective view, FIG. 3 is a front view, FIG. 4 is an internal plan view, FIG. 5 is a right side view, FIG. 6 is a left side view and FIG. 7 is a rear view thereof.

FIGS. 9 and 10 show an example of an RF drawer cord, in which FIG. 9 is a perspective view showing the insertion of a female coaxial connector onto a male coaxial connector and FIG. 10 is a perspective view showing the disengagement of the female coaxial connector from the male coaxial connector.

FIGS. 14 and 15 show an example of a shield box constituting a part of a shield member, in which FIG. 14 is a perspective view of the shield box for a video deck and FIG. 15 is a perspective view of the shield box for a TV monitor.

FIGS. 16 and 17 show an example of the present invention, in which FIG. 16 is a front view, and FIG. 17 is a right side view thereof.

FIGS. 28 through 30 are drawings showing reproduced pictures, in which FIG. 28 is a reproduced picture of sample I (a prior art example), FIG. 29 is a reproduced picture of sample II and FIG. 30 is a reproduced picture of sample III (the embodiment of the present invention).

DESCRIPTION OF THE PREFERRED EMBODIMENTS

Figure 1:
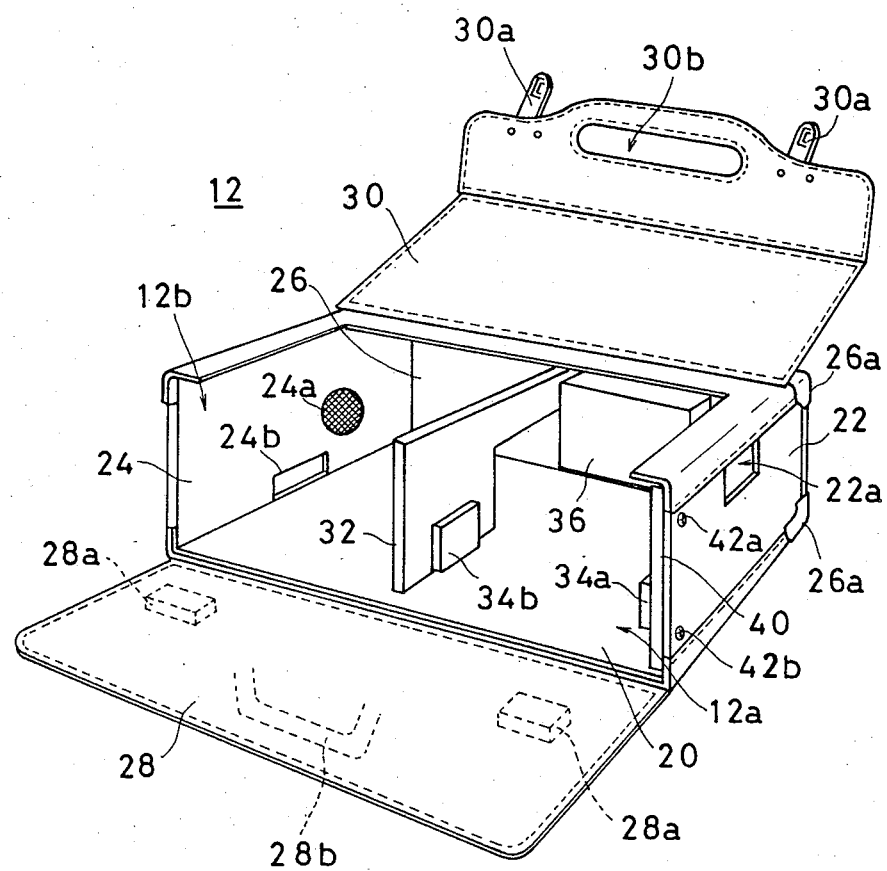
FIG. 1 is a perspective view showing an example of a case used in an embodiment of the present invention.

A case 12 is made of a ligneous material such as a veneer plate covered thereon by a leather material such as a synthetic leather and a synthetic resin material. The case 12 comprises a bottom 20, a right side portion 22, a left side portion 24, a rear portion 26, a front cover 28 and a top cover 30 and a rectangular space is defined by the components previously mentioned.

The metal fittings 28a and 30a mutually engageable are fixed respectively to the front cover 28 and the top cover 30 of the case 12. By engaging the metal fittings 28a and 30a, the front cover 28 and the top cover 30 may be closed and the case 12 may be retained in this position. Then, in this closed position, a handle 28b formed on the front cover 28 extends through an aperture 30b formed on the top cover 30 so that the case 12 is portable. When placing the case 12 down, reinforcing metal fittings 26a fixed to each corner of the rear portion 26 of the case 12 serve as the legs.

A partition piece 32 is formed widthwise generally in the center within the case 12 a right angle to the bottom 20, so that the space in the case 12 is divided into a right space 12a and a left space 12b.

In the right space 12a of the case 12, a pedestal piece 34a is formed on the left side of the right side portion 22 of the case 12 and a pedestal piece 34b is fixed to the right side of the partition piece 32.

Figure 2:
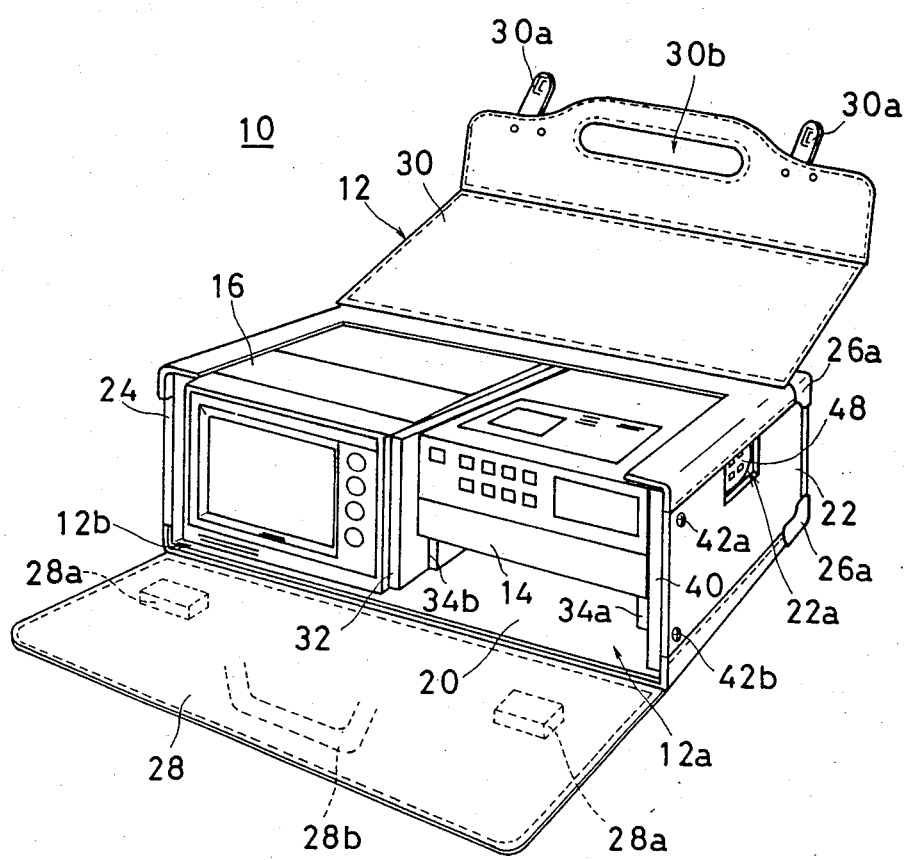
Figure 3:
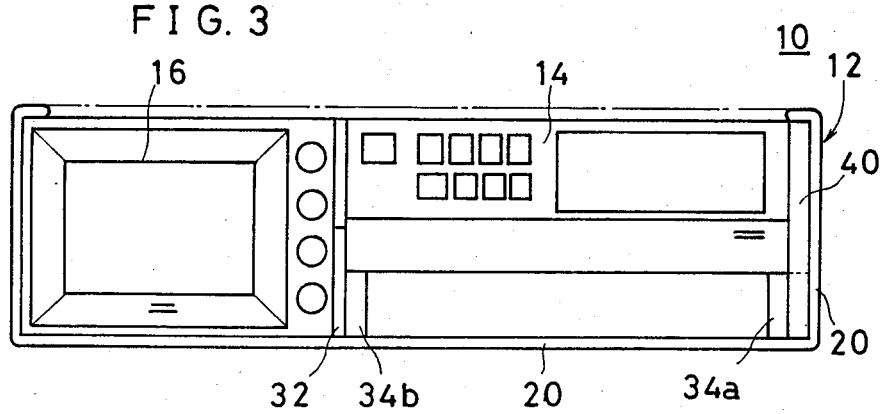

Then, as shown in FIGS. 2 and 3, a video deck 14 is stored in the space 12a and a TV monitor 16 is stored in the space 12b of the case 12. As the video deck 14, for example, a Canon Portable Video Recorder VR-L50, by Canon Inc. may be used and as the TV monitor 16, for example, a Hitachi IC Transistor Color Monitor Model 5, C5-612S, by Hitachi, Ltd. may be used.

Moreover, a video disc may be used as a video apparatus and as the monitor, liquid crystal, plasma and EL displays, etc. may be used besides the CRT display.

In the meantime, a shield box 36 is mounted on the rear portion 26 inside the right space 12a of the case 12 as shown in FIG. 1. The shield box 36 is formed by a conductive material such as a metal like aluminum and a conductive resin and the like. In the shield box 36, as clearly seen in FIG. 4, there is provided a switching power supply 18. As the switching power supply 18, for example, a K Series Switching Regulating K25 by Elco Co. may be used.

Figure 4:
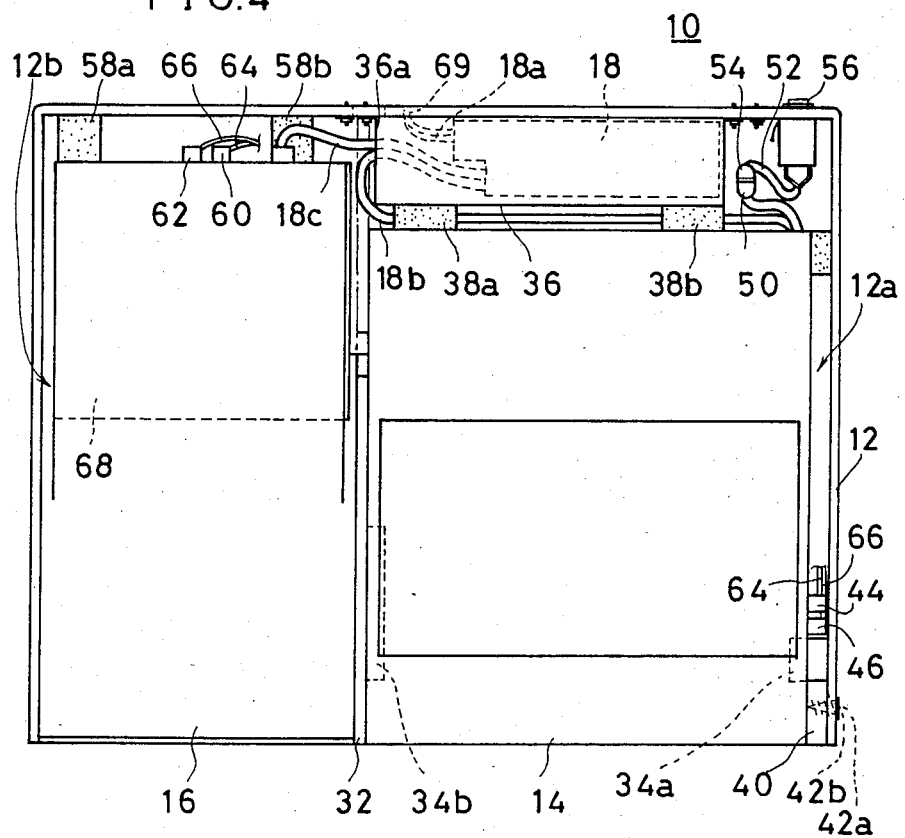
Figure 7:
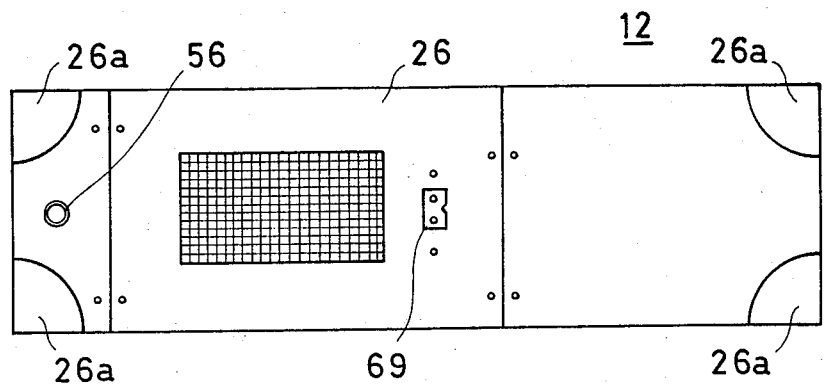

The video deck 14 is contained in the space 12a of the case 12 by being placed on the pedestal pieces 34a and 34b, and retaining members 38a and 38b are stuck onto the rear end thereof, for example, by an adhesive as shown in FIG. 4. The retaining members 38a and 38b are made of an elastic material such as urethane, sponge and rubber. Accordingly, the rear side of the video deck 14 is in contact with the shield box 36 via the retaining members 38a and 38b.

Meanwhile, a left side wall of the video deck 14 is in contact with the partition piece 32, while a right side wall thereof is arranged apart from the right side portion 22 of the case 12 and a supporting member 40 is disposed therebetween.

The supporting member 40 is fixed at the two upper and lower portions thereof by a member such as wood screws 42a and 42b from the surface side (outside of the case 12) of the right side portion 22 of the case 12. Thus, the video deck 14 is held between the partition piece 32 and the right side portion 22 and retained rigidly inside the case 12. The supporting member 40 may be dismounted by removing the wood screws 42a and 42b. By dismounting the supporting member 40, removal and insertion of the video deck 14 from the case 12 may be accomplished smoothly.

On the right side wall of the video deck 14, terminals 44 and 46 for video and voice outputs are mounted. These terminals are sufficiently spaced from the right wall portion 22 of the case 12 so as not to make contact therewith when the video deck 14 is stored.

A space is formed between the bottom 20 of the case 12 and the bottom of the video deck 14 by the pedestal pieces 34a and 34b. A user may store, for example, an AC cord 70 shown in FIG. 8, an RF drawer cord 80 shown in FIG. 9, video tapes and so on in the space. Accordingly, the user may carry associated equipment in one case 12 in a package.

Moreover, a square aperture 22a is formed as shown in FIG. 5 at the upper center of the right side portion 22 of the case 12 corresponding to a camera input terminal 48 formed on the right side wall of the video deck 14. Through the square aperture 22a a video camera (not shown) may be connected to video deck 14 from outside the case 12.

Furthermore, a circular net aperture 24a is formed on the left side portion 24 of the case 12 to the left of the center corresponding to a speaker of the monitor 16 as particularly shown in FIG. 6. Then, on the right side from the center of the left side portion 24 of the case 12, an aperture 24b is formed corresponding to a vertical-hold controlling knob 16a, a brightness controlling knob 16b and an earphone jack 16c formed on the left side of the monitor 16.

On the TV monitor 16, a shield plate 68 is an L-shaped cross section for shielding the right side wall and a part of the bottom thereof is mounted as particularly shown in FIG. 4. The shield plate 68 is attached, for example, with double-side adhesive tape. Then, on the rear portion of the TV monitor 16, retaining members 58a and 58b are fixed at two right and left portions thereof, as particularly shown in FIG. 4. The retaining members 58a and 58b are formed by elastic material such as urethane, sponge, and rubber. Accordingly, the monitor 16 is retained rigidly inside the case 12 apart from the rear portion 26 of the case 12.

Next, referring to FIG. 11, the electric connections of the video deck 14, the monitor 16, the switching power supply 18 and so on will be described in detail.

Figure 11:
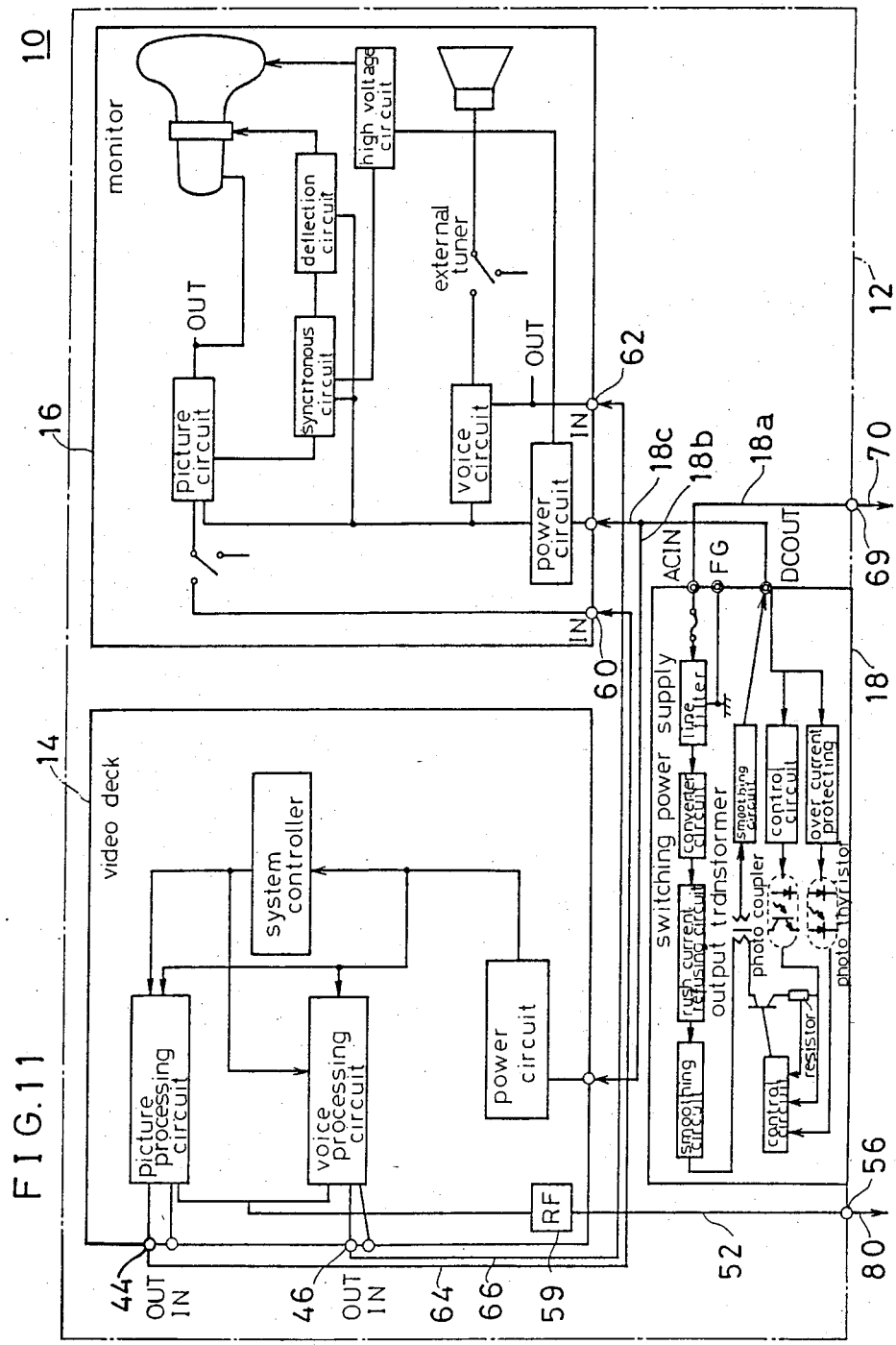
FIG. 11 is a block diagram of the portable type audio-visual apparatus shown in FIGS. 2 through 7.

The video deck 14 includes a power circuit, a system controller, a picture processing circuit and a voice processing circuit and so on as particularly shown in the block diagram of FIG. 11.

The monitor 16 includes a power circuit, a picture circuit, a synchronous circuit, a deflection circuit, a high voltage circuit, a CRT, a voice circuit, a speaker and so on.

The switching power supply 18 includes a line filter, a converter circuit, a rush current refusing circuit, a smoothing circuit, an output transformer, a rectifier smoothing circuit, a control circuit, an overcurrent protecting circuit and so on.

Figure 8:
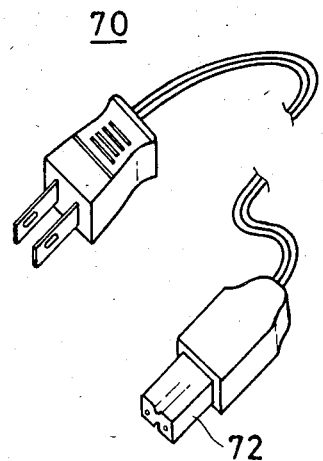
FIG. 8 is a perspective view showing an example of an AC cord.

The AC power input terminal of the switching power supply 18 is connected to a male connector 69 mounted through the rear portion 26 of the case 12. A female connector 72 of the AC cord 70 shown in FIG. 8 is inserted into the connector 69 and an AC source is supplied to the switching power supply 18 through the AC cord 70.

The DC power output terminal of the switching power supply 18 is connected to the DC power input terminal of the video deck 14 and the DC power input terminal of the monitor 16 respectively by coaxial cord 18b and 18c led through the aperture 36a on the shield box 36. Accordingly, DC power may be supplied to the video deck 14 and the monitor 16 by one switching power supply 18. Since the power device of the video deck 14 and the monitor 16 is constituted by one switching power supply 18 the size and weight of the portable type audio-visual apparatus may be reduced as compared with the prior art having a power device for each piece of audio-visual equipment, thus resulting in considerably easy transportation thereof as compared with the prior art.

Since the switching power supply 18 as the power device is shielded from the video deck 14 and the monitor 16 by the shield box 36, the noise generated therefrom will not influence the voice output or the video output of the monitor 16 negatively.

Now, in the embodiment, although the power device of the video deck and the monitor is constituted by one switching power supply, two power devices for the video deck and the monitor may be also used.

Furthermore, the power from the DC source outside the case may be supplied to the video deck and the monitor by connecting a jack between the DC power output terminal of the switching power supply 18 and the coaxial cords 18b and 18c and mounting the jack so as to extend through the case 12, then inserting a plug connected to a DC source outside the case such as a car battery and the like thereinto.

A video output terminal 44 and a voice output terminal 46 of the video deck 14 and a video input terminal 60 and a voice input terminal 62 of the monitor 16 are respectively connected by connecting coaxial cables 64 and 66 as particularly shown in FIG. 11. Then, the connecting coaxial cables 64 and 66 are led to the rear side of the video deck 14 from the right side of the video deck 14 through the rear side thereof.

An RF output terminal 50 is drawn out from the rear side of the video deck 14 as shown in FIG. 4. A connector 54 connected to one end of a coaxial cable 52 is inserted into the RF output terminal 50 and the other end thereof is connected to a jack 56 mounted through the rear portion 26 of the case 12. The jack 56 is merely required to be mounted through the case 12, an accordingly it may be mounted, for example, through the right side portion 22 of the case 12.

Figure 9:
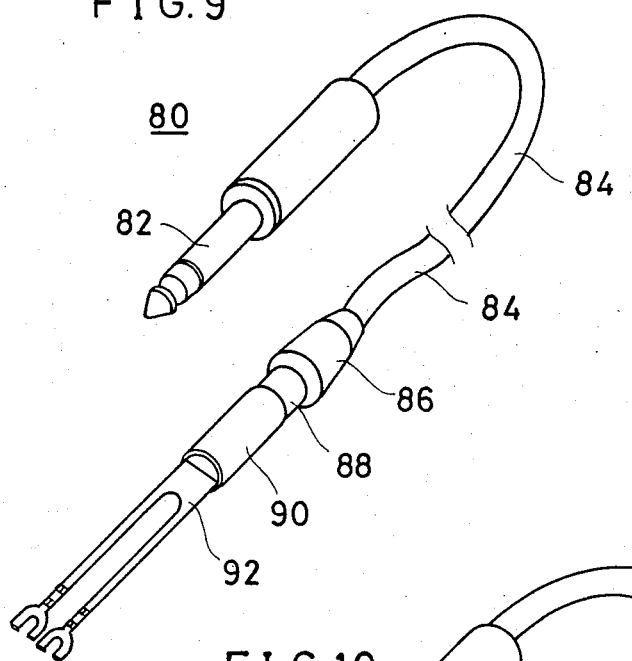

To the jack 56, for example, a plug 82 of the RF drawer cord 80 shown in FIG. 9 may be inserted from outside of the case 12. Accordingly, the RF output terminal 50 of the video deck 14 may be drawn out by the cord 80 as the video deck 14 being stored in the case 12. The RF output terminal 50, namely, the cord 80 is used when connecting to the other monitor (not shown). When connecting the RF output terminal 50 of the video deck 14 and the external monitor, the covers 28 and 30 of the case 12 stay closed as is, thus resulting in a favorable space factor. This structure provides good results to the user when using the portable type audio-visual apparatus 10 by connecting to an external monitor in such limited space.

A video signal (a base band signal) and a voice signal may be drawn out from the video deck 14 when necessary, in the same manner as previously described.

The RF drawer cord 80 includes the plug 82 as particularly shown in FIG. 9. To the plug 82, one end of a coaxial cable 84 is connected and, to the other end thereof a male coaxial connector 86 is coupled, to which a female coaxial connector 88 is inserted. Then, to the female coaxial connector 88, an input side of an impedance matching device 90 such as a balun transformer is connected and to an output side thereof a parallel feeder 92 is connected.

Figure 10:
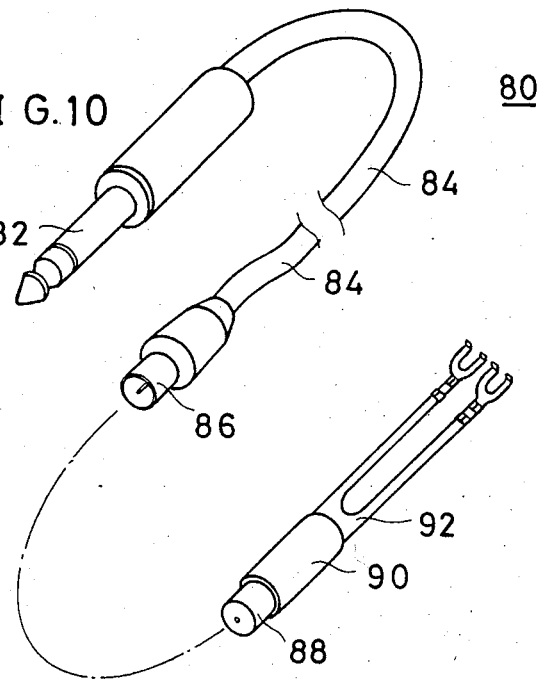

In the RF drawing cord 80, the female coaxial connector 88 may be disconnected from the male coaxial connector 86 as shown in FIG. 10. When disengaging the female coaxial connector 88 from the malee coaxial connector 86, the latter may be connected to an RF input terminal of a female coaxial connector of an external monitor. Thus the coaxial cable and the parallel feeder can be used in common. Accordingly, when using the RF drawer cord 80, it is not necessary to prepare the two cords separately for the coaxial cable and the parallel feeder as in the past.

In this embodiment, although one special cord was used as the RF drawer cord, two cords for the coaxial cable and the parallel feeder may be used as in the past.

Next, referring to FIGS. 12 through 18, another embodiment of the present invention will be described.

Figure 12:
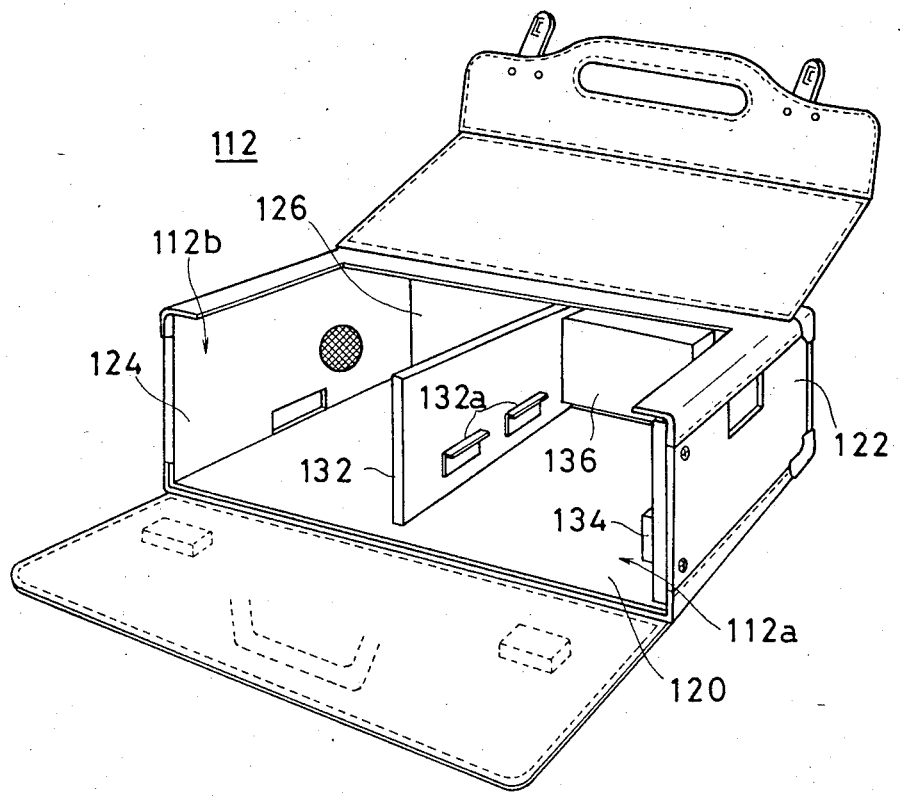
FIG. 12 is a perspective view showing a case used in an embodiment of the present invention.

Inside a case 112, a partition piece 132 is formed generally in the center widthwise and protrusion at a right angle to a bottom 120. The partition 132 is made of a conductive material such as a metal like aluminum, copper, synthetic resin, or synthetic rubber covered with a relatively soft leather material and the like having an excellent surface such as a synthetic leather and so on. In a right side space 112a of the case 112, a shield box 136 is mounted on an inner surface of the rear portion 126 of the case 112 as shown in FIG. 12. The shield box 136 is formed with a conductive material such as a metal like aluminum, copper, conductive resin, conductive rubber and so on.

Figure 17:
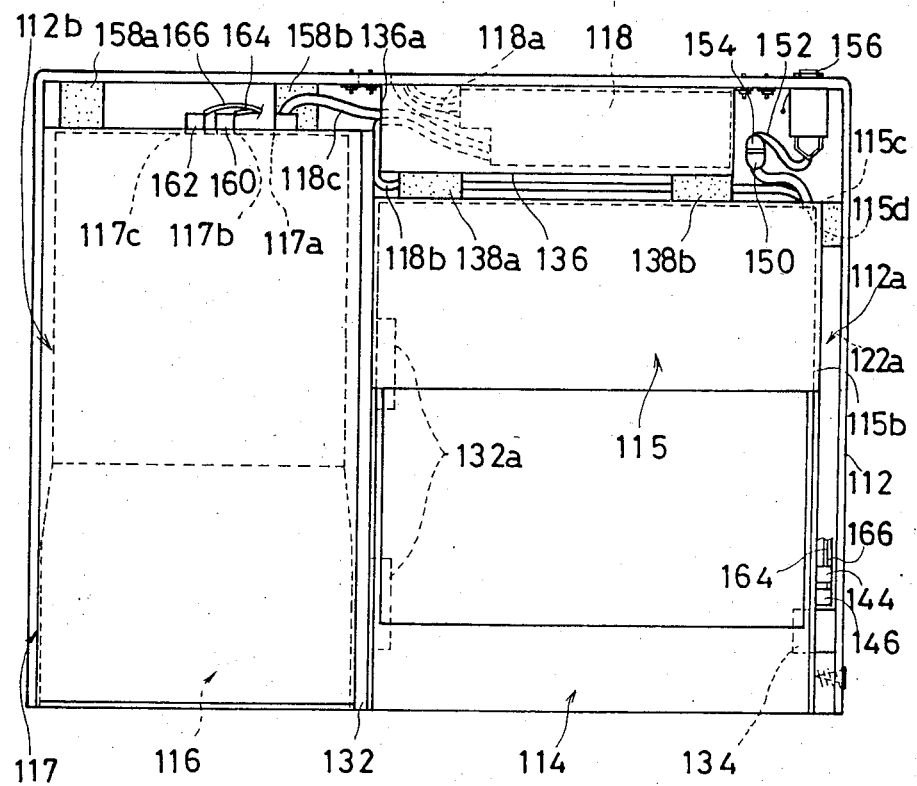
Figure 18:
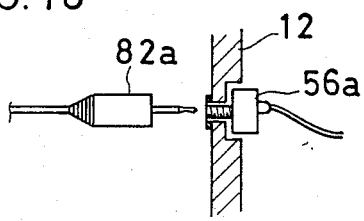
FIG. 18 is an illustrated view showing a pin jack and a pin plug as an example of a jack and a plug.

Inside the shield box 136, a switching power supply 118 is stored as particularly shown in FIG. 17.

A video deck 114 is stored in the space 112a of the case 112 as the rear portion thereof is contained in a shield box 115. That is, the video 114 is placed on pedestal pieces 132a and 134 together with the shield box 115.

The shield box 115 is formed in a box shape having an open front and a bottom 115a thereof extending forward. The shield box 115 is formed with a conductive material such as a metal like aluminum, copper conductive resin, conductive rubber and so on. For example, when an aluminum plate is used, a thickness of 0.4 mm is used taking into account its weight and strength.

On the upper right side of the shield box 115, a notch 115b is formed corresponding to a camera input terminal 148 (FIG. 13) formed on the right side wall of the video deck 114. Then, on the rear portion of the shield box 115, two holes 115c and 115d are formed lengthwise. The hole 115c is for leading a coaxial cord 118b (FIG. 17) to be connected to a DC power input terminal of the video deck 114 therethrough, and the other hole 115d is for leading an RF output terminal 150 (FIG. 17) of the video deck 114 therethrough. A rear portion of the video deck 114 is contained in the shield box 115, and thereby the rear and lower portions of the video deck 114 are shielded.

Figure 13:
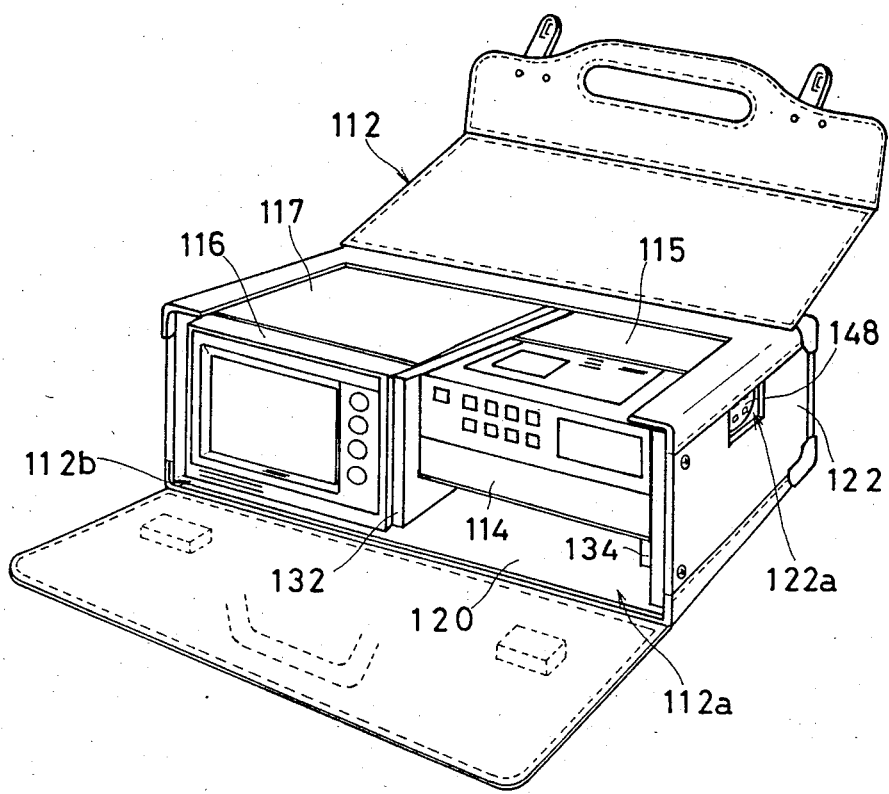
FIG. 13 is a perspective view showing a video deck and a TV monitor stored.
Figure 14:
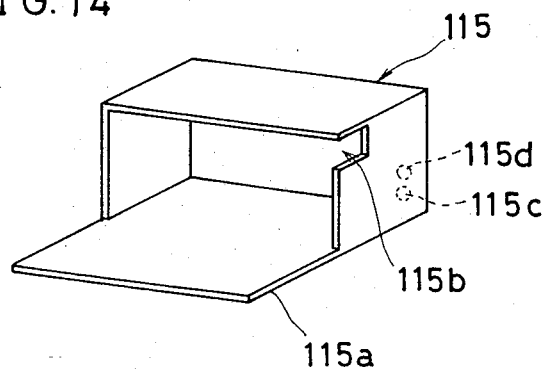
Figure 15:
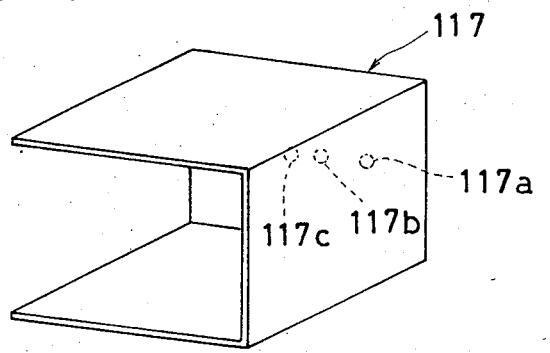
Figure 16:
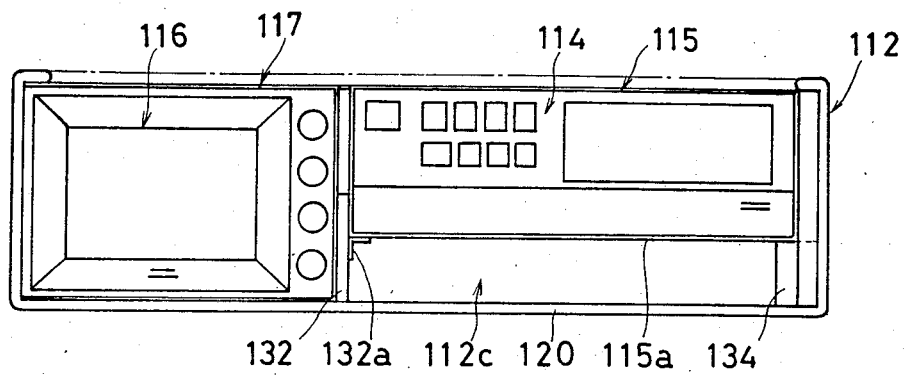

A TV monitor 116 is stored in a space 112b as the rear portion thereof is contained in a shield box 117 as shown in FIG. 13.

The shield box 117 is formed in a box shape having an opened front and left side thereof and formed with the same conductive material as the shield box 115 previously described.

On the rear portion of the shield box 117, three holes 117a, 117b and 117c are formed widthwise. The hole 117a is for leading a DC power input terminal of the TV monitor 116 therethrough, while holes 117b and 117c are for leading a video input terminal 160 and a voice input terminal 162 of the TV monitor 116 respectively therethrough. Then, the TV monitor 116 is stored in the shield box 117, and thereby the upper, lower, right and rear portions of the TV monitor 116 are shielded.

On the rear end of the shield box 115, retaining members 138a and 138b are stuck as shown in FIG. 17, which are formed with an elastic material such as urethane, sponge, sponge rubber, rubber and the like. Accordingly, the rear portion of the shield box 115 is in contact with a shield box 136 via the retaining members 138a and 138b. A retaining member made of an elastic material such as rubber and the like having a shape suitable for receiving the rear portion of the shield box 115 therein, may be formed inside the case 112 in place of the retaining members 138a and 138b. Thereby, the shield box 115, namely, the video deck 114 may be retained more rigidly.

Furthermore, on the rear portion of the shield box 117, retaining members 158a and 158b are fixed on the both sides as particularly shown in FIG. 17. The retaining members 158a and 158b are formed with an elastic material such as urethane, sponge, sponge rubber, rubber and the like. Accordingly, the TV monitor 116 and the shield box 117 are retained rigidly in the case 112 spaced from the rear portion 126 thereof. A retaining member made of an elastic material such as rubber and the like having a shape suitable for receiving the rear portion of the shield box 117 therein, may be formed on the rear portion thereof in place of the retaining members 158a and 158b. Thereby, the shield box 117, namely, the TV monitor 116 may be retained more rigidly.

The switching power supply 118 as the power device is shielded from the video deck 114 and the TV monitor 115 by the shield box 136. The rear and lower portions of the video deck 114 are shielded by the shield box 115 and top, lower, right and rear portions of the TV monitor 116 are shielded by the shield box 117. Then the video deck 114 and the TV monitor 116 are shielded by the partition piece 132. Accordingly, the noise generated from the switching power supply 118 and the TV monitor 116 will not influence the voice output and the picture output of the TV monitor 116 negatively.

Figure 19:
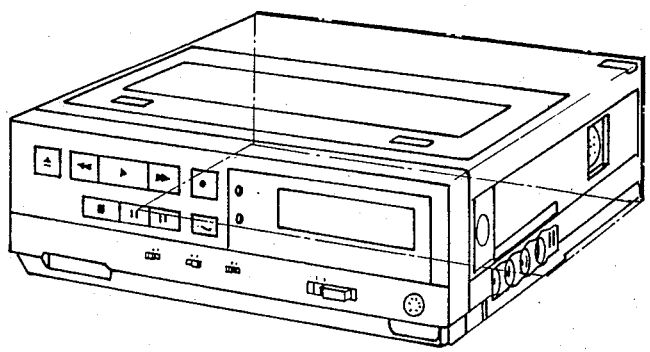
FIG. 19 is a perspective view showing a preferred example of the portions of a video-deck to be shielded in single broken lines.

As such, in order to shield the noise from the switching power supply 118 and the TV monitor 116, the rear and the bottom of the rear half containing the preamplifier which picture signal is subjected to an influence by the noise, may be shielded as shown in single dotted lines in FIG. 19 as to the video deck 114.

Figure 20:
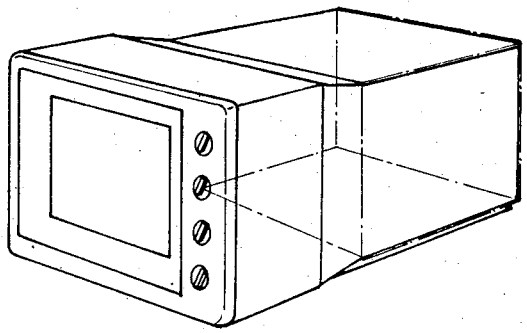
FIG. 20 is a perspective view showing a preferred example of the portions of a TV monitor to be shielded in single broken lines.

As to the TV monitor 116, the rear, the bottom of the rear half and the right side of the rear half containing a high voltage transformer, a board and so on as the noise source may be shielded as shown in single dotted lines in FIG. 20. In short, the video deck, the TV monitor and the switching power supply are merely required to be shielded by the shielding members therebetween.

Next, referring to FIG. 17, connections for the equipment will be described.

A video output terminal 144 and a voice output terminal 146 of the video deck 114 and the video input terminal 160 and the voice input terminal 162 of the TV monitor 116 are connected respectively by connecting coaxial cables 164 and 166 as particularly shown in FIG. 17. In this case, the video input terminal 160 and the voice input terminal 162 of the TV monitor 116 are led through the holes 117b and 117c formed on the rear portion of the shield box 117, and the connecting coaxial cables 164 and 166 for the each terminal are led to the rear of the TV monitor 116 from the right side of the video deck 114 through the rear side thereof.

As shown in FIG. 17, an RF output terminal 150 of the video deck 114 is drawn out from the rear portion of the shield box 115. In this case, the RF output terminal 150 of the video deck 114 is led through the hole 115d on the rear portion of the shield box 115 and a connector 154 connected to a coaxial cable 152 at one end is inserted thereinto. Now the other end of the coaxial cable 152 is connected to a jack 156 mounted through the rear portion 126 of the case 112 inside the case 112. The jack 156 merely must be mounted through the case 112, and for example, it may be mounted through the right side portion 122.

The jack 156 and a plug 182 may be constituted by a pin jack 156a mounted through the case 112 and pin plug 182a engageable thereto or further by another type of jack and plug.

As a conductive material for shield boxes 115, 117, 136 and the partition piece 132, a material coated with conductive paint or a magnetic alloy such as a permalloy may be used besides those examples previously mentioned.

Figure 21:
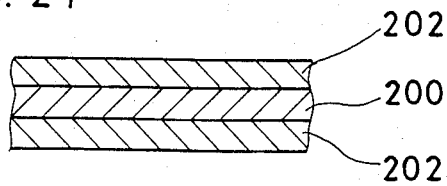
FIG. 21 is a cross-sectional view showing an example of a material of a shield member.
Figure 22:
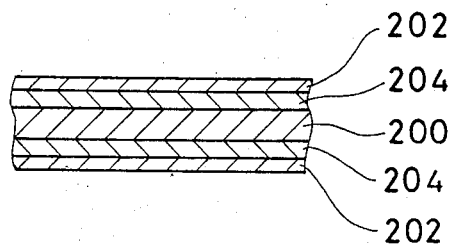
FIG. 22 is a cross-sectional view showing another example of a material of a shield member.
Figure 23:
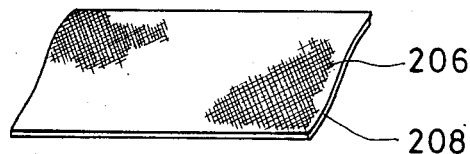
FIG. 23 is a perspective view showing still another example of a material of a shield body.
Figure 24:
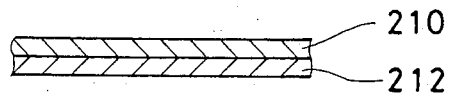
FIG. 24 is a cross-sectional view showing yet another embodiment of a material of a shield member.

Furthermore, in the embodiment described above, as the material for shield boxes 115, 117 and 136, although conductive material alone was used, a conductive material 220 which main surface is covered with a surface material 202 consisting of the leather material such as the synthetic leather may be used. Moreover, the conductive material 200 consisting of a relatively soft material, which main surface is covered by a rigid ligneous material 204 such as a veneer plate, and the surface thereof is covered by the leather material 202 such as the synthetic leather, may be used as the material for shield boxes 115, 117 and 136 and the partition piece 132 as shown in FIG. 22. As shown in FIG. 23, a material consisting of a metal screen 206 such as aluminum, copper and so on stuck with double sided adhesive tape 208 or, for example, a metal foil or a metal plate 210 such as aluminum and the like having an adhesive layer 212 on one main surface thereof as shown in FIG. 24 may be stuck to the surfaces of the video deck 114, the TV monitor 116 and the switching power supply 118. As such, when the metal materials such as the metal screen, the metal foil, and the metal plate are stuck, the thickness can be reduced without influencing the strength, thus retarding the increase in weight caused by the metal material. In the material shown in FIGS. 21 and 22, it is understood that an insulating material such as paint and synthetic resin may be used in place of the surface material 202 consisting of the leather material or the ligneous material 204.

FIG. 19 is a perspective view of another case different from the embodiment previously mentioned.

FIG. 20 is a plan view of the case shown in FIG. 19.

Inside a case body 312, partition piece 332 for the small size audio-visual apparatus (TV monitor 116, video deck 114, etc.) having a U-shaped front section is mounted at right angle to a bottom 320 generally in the center widthwise, which is made of a light frame such as aluminum and the like.

Between the partition piece 332 aforementioned and and a right side portion 322, fixing pedestals 334A and 334B are mounted respectively in parallel.

A power source 118 for the small size audio-visual apparatus is provided independent of the small size audio-visual apparatus (TV monitor 116, video deck 114, etc.). The power source 118 is stored and secured inside the case bottom 320 in a most tightly fitting state to the shape of the case body 312 so as not to leave any extra space therein. The power source 118 is fixed to the base body 312 with a removable tape utilizing piles, so called, a magic tape 319A.

Meanwhile, magic tape 319B for fixing the small size audio-visual apparatus (video deck 114) is fixed to the surface of the fixing pedestal 334B.

By fixing in such a manner, the damage caused by the bumping of the each piece of equipment can be prevented and the maintenance thereof may be simplified.

Figure 26:
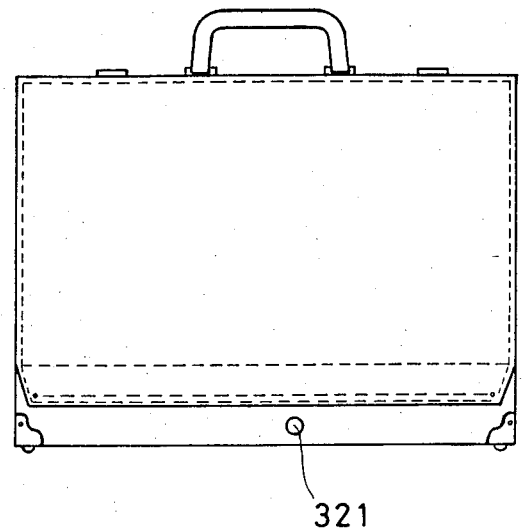
FIG. 26 is a plan view of the case body shown in FIG. 25.

A hole 321 for installing an antenna is formed near the rear portion 320 of the case body 312 as shown in FIG. 26 in such a way that it comes to the upper surface in use, that is, when laying down.

By disposing the hole 321 for the antenna (shown in FIG. 26), the antenna can be installed and the TV broadcasting can be received and the picture thereof may be recorded.

Figure 25:
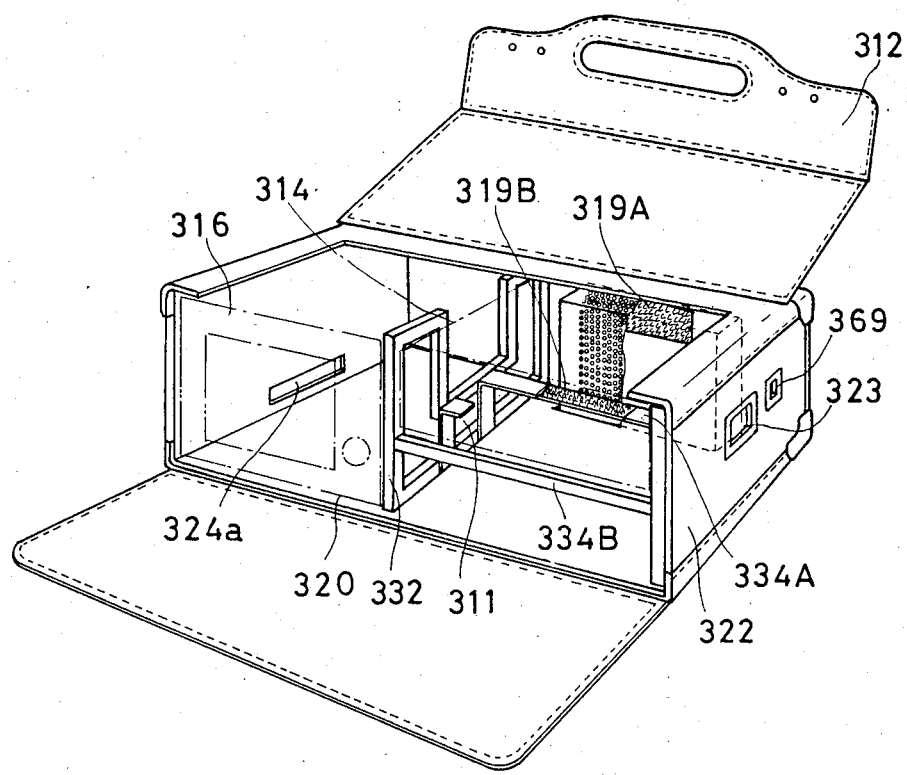
FIG. 25 is a perspective view of a case body different from the embodiments previously mentioned.

An intake hole 369 from an external power source is provided on the right side portion 322 as shown in FIG. 25 and formed so as to be able to receive power easily. A hole 323 for video deck control and for taking out input and output cords for the picture and voice signals is formed similarly on the right side portion 322.

A monitor control hole 324a is formed on the left side portion as shown in FIG. 25, so that the monitor may be controlled easily from the outside.

Since the holes 369, 323 (shown in FIG. 25) and 324a (shown in FIG. 25) are provided, the video deck may be controlled while stored in the case. Furthermore, due to this structure, not only control is convenient but also the picture and voice signals from the RF signal may be taken out easily. Thereby, the storing spaces for the TV monitor 316 and the video deck 314 may be minimized simultaneously.

Figure 27:
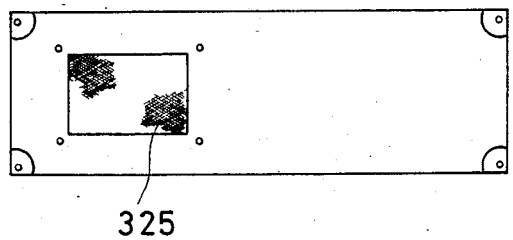
FIG. 27 is a side view of the case body shown in FIG. 25.

A radiating hole 325 is provided on the bottom 320 of the case body 312 as shown in FIG. 27. The radiating hole 325 serves for dissapating the heat from the power source 7 of the small size audio-visual apparatus. Although it is provided on the bottom 320, the radiation will not deteriorate the case since it is laid down in use.

As such, the advantages of fixing by the partition piece 332 and the fixing pedestals 334A and 334B, enable the shortening of the distance between the TV monitor 316 and the video deck 314, thus reducing the width of the case body 312 as well as preventing any trouble caused by the bumping of the TV monitor 316 and the video deck 314, resulting in increased safety.

A space 311 (refer to FIG. 25) formed in the body portion of the partition piece 332A is disposed under a boundary between the video deck 316 and the TV monitor 316, thereby giving an advantage of drawing out the TV monitor 316 readily from the case body 312 as the wiring being connected therebetween.

As a mounting of the case body 312, not a conventional synthetic leather but materials such as a Kuraline (registered trade mark) by Kurare Co., Ltd. and a Pasco, a kind of paper, and so on were used in consideration of not only the reduction of weight but also the durability.

In such a case, although it must be smaller and lighter, according to the present invention, when taking the embodiment previously described as an example, the weight was reduced to about 6.3 kg from the total weight, which was 9 kg at the minimum in conventional devices including the small size audio-visual apparatus.

The volume decreased also to 39 cm wide×14.5 cm deep×29.5 cm high, from the past 41 cm wide×17 cm deep C 32 cm high.

Thereby, the weight has almost reached the maximum weight of 6 kg acceptable for a man to carry about relatively easily.

EXPERIMENTAL RESULTS

First a sample I was made for removing a conductive material of the partition piece 132, shield boxes 115, 117 and 136 of the embodiment shown in FIGS. 13 through 17. A sample II same as the embodiment shown in FIGS. 13 through 17 and a sample III same as the embodiment shown in FIGS. 2 through 4 were prepared.

Then, in samples I, II and III, a picture from the same video tape was reproduced and the presence of the noise was compared. In this case, an image signal totally in blue color is recorded on the video tape to clearly distinguish the noise in the reproduced picture.

Figure 28:
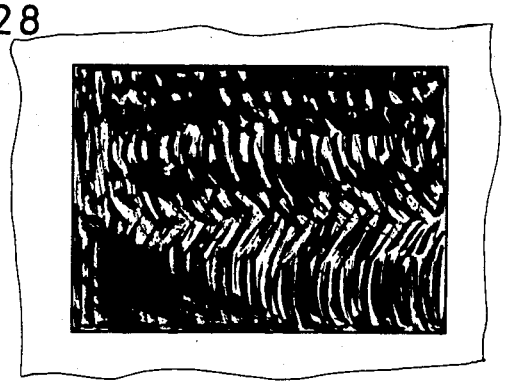
Figure 29:
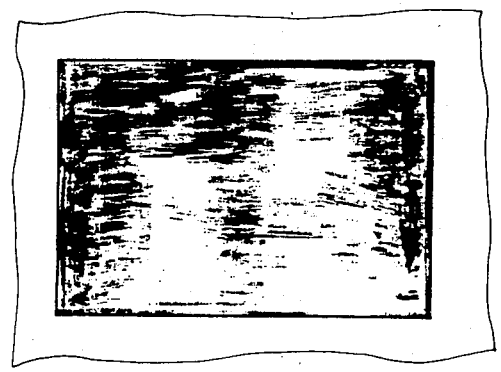
Figure 30:
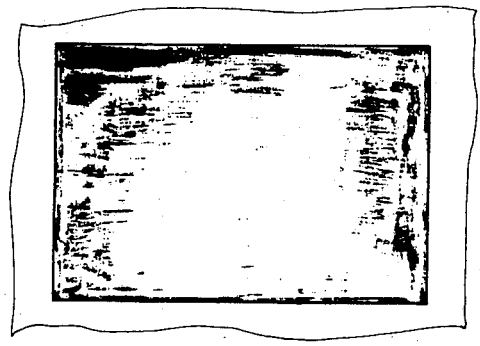

FIGS. 28, 29 and 30 show the reproduced pictures of samples I, II and III respectively. From the results shown in FIGS. 28 through 30, it is apparent that the picture reproduced by the same I includes the noise and the pictures reproduced by the samples II and III do not include the noise.

This is due to the fact that in sample I the radiation noises generated from the switching power supply and the TV monitor could not be shielded, but in sample II such radiation noises were shielded by the conductive material of the partition piece 132 and the shield boxes 115, 117 and 136, and in sample III such radiation noises could be shielded by the shield plate 68 and the shield box 36.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A portable case for audio-visual apparatus, comprising:
    a first case portion open at its top and front including a bottom portion and three side walls connected thereto so as to form a substantial portion of a generally rectangular box;
    a second case portion including a front cover and a top cover each pivotally connected thereto, said top cover being located and configured for covering the top opening and said front cover being located and configured for covering the front opening, said second portion being connected at one edge thereof to said first case portion to complete, when in a closed position, said generally rectangular box;
    a partition piece formed in said case for dividing said case into a first section and a second section;
    a TV monitor removably mounted in said first section;
    means for developing the signal displayed on said TV monitor mounted in said second section; and
    power source means, mounted in said case, for receiving AC power source from an external source, converting said AC power to DC power, and supplying DC power to said TV monitor and said developing means.

2. The portable case for audio-visual apparatus in accordance with claim 1, wherein said power source means is mounted in a rear portion of said case.

3. The portable case for audio-visual apparatus in accordance with claim 1, further comprising an elastic retaining member fixed between said developing means and said power source means.

4. The portable case for audio-visual apparatus in accordance with claim 1, wherein said power source means is fixed inside said case body by tape.

5. The portable case for audio-visual apparatus according to claim 1, further comprising means, mounted on said partition piece and a side wall of said second section, for elevating said developing means at a position above said bottom portion.

6. The portable case for audio-visual apparatus according to claim 1, further comprising means, connected between said partition piece and a side wall of said second section; for elevating said developing means at a position above said bottom portion.

7. The portable case for audio-visual apparatus according to claim 6, wherein said developing means is placed on said elevating means and is fixed thereto by tape composed of pile fabric.

8. The portable case for audio-visual apparatus according to claim 5, wherein a connecting coaxial cable is stored in a space between said elevating means and said bottom portion.

9. The portable case for audio-visual apparatus according to claim 6, wherein a connecting coaxial cable is stored in a space between said elevating means and said bottom portion.

10. The portable case for audio-visual apparatus according to claim 1, further comprising a supporting member located between said developing means and a side wall of said second section.

* * * * *